(12) United States Patent
Dawes

(10) Patent No.: US 9,084,358 B2
(45) Date of Patent: Jul. 14, 2015

(54) SUBSEA PRESSURE COMPENSATION SYSTEM

(75) Inventor: John Arthur Dawes, Nesoya (NO)

(73) Assignee: SIEMENS OIL AND GAS OFFSHORE AS, Oslo (NO)

( * ) Notice: Subject to any disclaimer, the term of this patent is extended or adjusted under 35 U.S.C. 154(b) by 435 days.

(21) Appl. No.: 13/574,152

(22) PCT Filed: Jan. 19, 2010

(86) PCT No.: PCT/EP2010/000272
§ 371 (c)(1),
(2), (4) Date: Jul. 19, 2012

(87) PCT Pub. No.: WO2011/088840
PCT Pub. Date: Jul. 28, 2011

(65) Prior Publication Data
US 2012/0291688 A1    Nov. 22, 2012

(51) Int. Cl.
| F16K 17/36 | (2006.01) |
| H05K 5/06 | (2006.01) |
| B63C 11/00 | (2006.01) |
| B63G 8/00 | (2006.01) |

(52) U.S. Cl.
CPC ............... *H05K 5/068* (2013.01); *B63C 11/00* (2013.01); *B63G 8/00* (2013.01)

(58) Field of Classification Search
CPC ..... H05K 5/068; B65D 88/78; E21B 33/0355
USPC ..................................... 137/81.1, 81.2, 236.1
See application file for complete search history.

(56) References Cited

U.S. PATENT DOCUMENTS

| 2,579,005 | A | * | 12/1951 | Lambert | 405/59 |
| 3,400,541 | A | * | 9/1968 | Schlissler et al. | 405/190 |
| 3,727,418 | A | * | 4/1973 | Glazier | 62/53.1 |
| 3,987,708 | A | | 10/1976 | Uhrich | 92/134 |
| 4,187,682 | A | | 2/1980 | Shen | 60/413 |
| 5,357,999 | A | * | 10/1994 | Loth et al. | 137/81.2 |
| 6,964,304 | B2 | * | 11/2005 | Skeels et al. | 166/365 |
| 7,520,129 | B2 | | 4/2009 | Springett | 60/398 |

(Continued)

FOREIGN PATENT DOCUMENTS

| CN | 2547634 Y | 4/2003 | B63C 11/52 |
| CN | 201235921 Y | 5/2009 | B63C 11/52 |
| CN | 101535593 A | 9/2009 | E21B 33/035 |

(Continued)

OTHER PUBLICATIONS

Chinese Office Action, Application No. 201080061868.2, 13 pages, Mar. 21, 2014.

(Continued)

*Primary Examiner* — John K Fristoe, Jr.
*Assistant Examiner* — Reinaldo Sanchez-Medina
(74) *Attorney, Agent, or Firm* — Slayden Grubert Beard PLLC

(57) ABSTRACT

A system for pressure compensation, e.g., for pressure compensation in a subsea environment, may include a fluid filled enclosure surrounding a cavity, a first pressure compensator having a first chamber and a second chamber, the first chamber being in fluid communication with the cavity, and a second pressure compensator having a third chamber and a fourth chamber, wherein the third chamber of the second pressure compensator is in fluid communication with the second chamber of the first pressure compensator.

16 Claims, 3 Drawing Sheets

(56) References Cited

U.S. PATENT DOCUMENTS 8,464,745 B1 * 6/2013 Ringer .................... 137/81.2
2008/0302115 A1 12/2008 Eknes et al. ................ 62/183

FOREIGN PATENT DOCUMENTS

| GB | 1305990 A | 2/1973 | ............. B63C 11/52 |
| SU | 887357 A1 | 12/1981 | ............. B63C 11/52 |
| WO | 2006/100518 A1 | 9/2006 | ............. B63C 11/00 |
| WO | 2008/055515 A1 | 5/2008 | ............... B63G 8/08 |

OTHER PUBLICATIONS

International Search Report and Written Opinion, Application No. PCT/EP2010/000272, 19 pages, Oct. 29, 2010.

* cited by examiner

SUBSEA PRESSURE COMPENSATION SYSTEM

CROSS-REFERENCE TO RELATED APPLICATIONS

This application is a U.S. National Stage Application of International Application No. PCT/EP2010/000272 filed Jan. 19, 2010, which designates the United States of America. The contents of which are hereby incorporated by reference in their entirety.

TECHNICAL FIELD

This disclosure relates to underwater pressure compensation systems.

BACKGROUND

For subsea equipment it may be a special task to be arranged such that they can operate reliably under a given pressure of sea water. Subsea enclosures for electrical or mechanical equipment can be divided in two groups, pressure resistant enclosures and pressure compensated enclosures. The latter are characterised that the enclosure is fluid filled and the pressure inside the enclosure is about the same as the environment or a little higher.

With pressure compensation it is the task to maintain sufficient pressure within the enclosure, e.g. to withstand the pressure from ambient sea water. The pressure within the enclosure may be less than the pressure of the sea water, thus a subsea equipment housing or enclosure need only withstand a pressure differential between the external pressure exerted on the enclosure by the sea water and an internal pressure which is maintained within the enclosure.

To provide the appropriate fluid pressure, in certain applications hydraulic fluid within an enclosure is pressurised by a spring.

Besides, an encapsulation of subsea equipment in a closed housing may also prevent the ingress of sea water into the system.

SUMMARY

In one embodiment, a system for pressure compensation, particularly for pressure compensation in a subsea environment, includes a fluid filled enclosure surrounding a cavity, a first pressure compensator having a first chamber and a second chamber, the first chamber being in fluid communication with the cavity, and a second pressure compensator having a third chamber and a fourth chamber, wherein the third chamber of the second pressure compensator is in fluid communication with the second chamber of the first pressure compensator.

In a further embodiment, the first chamber of the first pressure compensator is separated from the second chamber of the first pressure compensator via a first bellow, and/or the third chamber of the second pressure compensator is separated from the fourth chamber of the second pressure compensator via a second bellow. In a further embodiment, the first bellow and/or the second bellow each have an element with a weight, particularly a dead weight, the element being arranged in respect of a bellow such that the weight of the element results in a force to reduce the stroke of the bellow.

In a further embodiment, the system further comprises: a first manifold for connecting the fluid filled enclosure with the first chamber to let pass a first fluid; and/or a second manifold for connecting the third chamber with the second chamber to let pass a second fluid; and/or an inlet opening to the fourth chamber to let pass an ambient third fluid, particularly sea water, from a surrounding of the system.

In a further embodiment, the fluid filled enclosure, filled by a first fluid, is enclosed by a further fluid filled enclosure, the further fluid filled enclosure surrounding a further cavity filled by a second fluid. In a further embodiment, the first pressure compensator and the second pressure compensator are both enclosed by the further fluid filled enclosure and both surrounded by the second fluid. In a further embodiment, the second chamber of the first pressure compensator includes a first opening to the further cavity of the further fluid filled enclosure and the third chamber of the second pressure compensator having a second opening to the further cavity, such as the third chamber of the second pressure compensator being in fluid communication with the further cavity and the second chamber of the first pressure compensator being in fluid communication with the further cavity. In a further embodiment, the second manifold provides additionally a connection to let pass a portion of the second fluid to the further cavity of the further fluid filled enclosure.

BRIEF DESCRIPTION OF THE DRAWINGS

Example embodiments will be explained in more detail below with reference to figures, in which.

DETAILED DESCRIPTION

Figure 1:
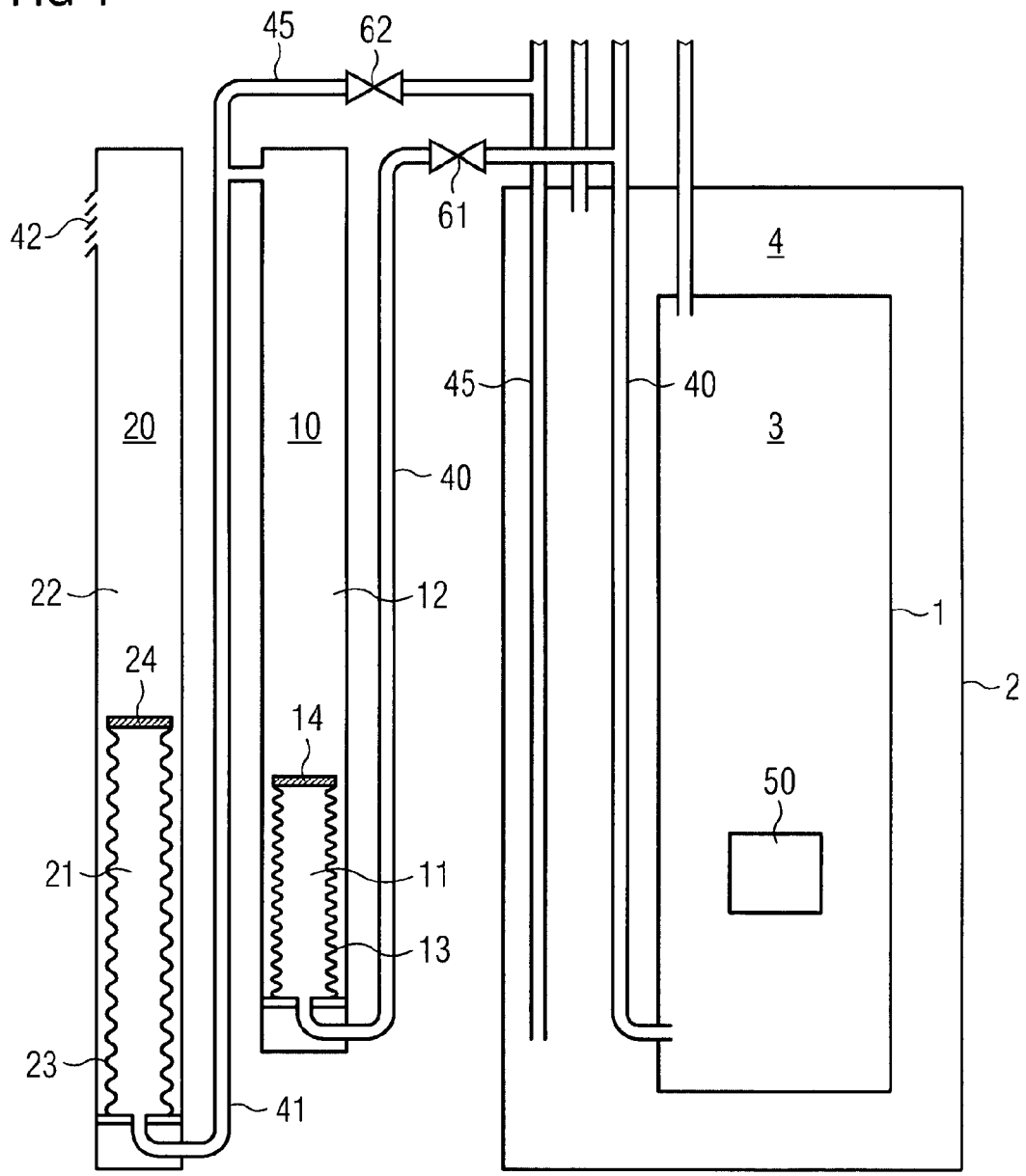
FIG. 1 shows schematically a double barrier pressure system with two pressure compensators outside of both enclosures, according to an example embodiment.

Some embodiments provide a system for pressure compensation, e.g., for pressure compensation in a subsea environment, comprising a fluid filled enclosure surrounding a cavity, a first pressure compensator having a first chamber and a second chamber, the first chamber being in fluid communication with the cavity and a second pressure compensator having a third chamber and a fourth chamber. The system is designed such that the third chamber of the second pressure compensator being in fluid communication with the second chamber of the first pressure compensator.

This may allow a better separation of the fluid from ambient sea water or other fluids surrounding the system.

A first fluid used inside the cavity of the fluid filled enclosure and the inside the first chamber may possibly a liquid, e.g., an oil.

A second fluid used inside the third chamber of the second pressure compensator and the second chamber of the first pressure compensator may also possibly a liquid, e.g., an oil, but may be of different type than the first fluid.

The system may be designed that neither the ambient sea water nor the first fluid or the second fluid will be mixed. They will be separated by solid flexible walls.

The first chamber of the first pressure compensator may be separated from the second chamber of the first pressure compensator via a first bellow, diaphragm, or bladder. The same may apply to the second pressure compensator, so that the third chamber may be separated from the fourth chamber via a second bellow, diaphragm, or bladder.

The housings of the first or second pressure compensator may be solid. The bellows may allow adjusting the volume of the chambers within the pressure compensator, such as an increase in volume of the first chamber will result in a decrease in volume of the second chamber by the same amount. In a similar manner, an increase in volume of the third chamber will result in a decrease in volume of the fourth chamber by the same amount. More generally, the volume adjustments of two chambers within one common pressure compensator may be reciprocal.

In one embodiment the first bellow and/or the second bellow may each be springless. Thus, a spring is not used to generate a wanted overpressure. Instead, the first bellow and/or the second bellow may each have an element with a weight, particularly a dead weight to generate the wanted overpressure to the fluid. This element may be arranged in respect of a bellow such that the weight of the element results in a force to reduce the stroke of the bellow. The bellows may be oriented that the motion of the bellow will be substantially in vertical direction, the element will be positioned in the most vertical position of the bellow, so that the force of gravity will cause the element to collapse the bellow, if no fluid was present to withstand the force of gravity. With a fluid present within the bellow, the element, dependent on its weight, will cause a force on that fluid so that an overpressure is generated.

The system may comprise a double shell design, in which the fluid filled enclosure, filled by a first fluid, being enclosed or encapsulated by a further fluid filled enclosure, the further fluid filled enclosure surrounding a further cavity filled by a second fluid.

Thus, enclosed electrical or mechanical equipment may be protected by two shells: an inner barrier by the fluid filled enclosure as defined before and an outer barrier by the further fluid filled enclosure. This may reduce the risk of leakage. Even if the outer barrier will become cracks, the equipment will be completely protected from sea water by the inner barrier.

An arrangement with a double shell design—provided by the fluid filled enclosure and the further fluid filled enclosure—may allow to have exactly only two pressure compensators, the said first pressure compensator and the said second pressure compensator for pressure and/or volume compensation of both the fluid filled enclosures. This may be advantageous to double shell solutions with four bellows as pressure compensators.

The pressure compensators may be located in different positions. E.g. both can be located outside of both fluid filled enclosures. Alternatively both could be located within the outer further filled enclosure, so that even the pressure compensators get protected by that enclosure. It may also be possible, that the first compensator may be located within the further filled enclosure, whereas the second compensator may be located outside of both fluid filled enclosures. This and other aspects can be seen in reference to the figures.

Some embodiments disclosed herein are described with reference to apparatus type claims whereas other embodiments are described with reference to method type claims. However, a person skilled in the art will gather from the above and the following description that, unless other notified, in addition to any combination of features belonging to one type of subject matter also any combination between features relating to different subject matters, in particular between features of the apparatus type claims and features of the method type claims is considered as to be disclosed with this application.

Referring now to FIG. 1, a technical equipment 50 for subsea operation is indicated schematically simply by a box. To protect this technical equipment 50 it is encapsulated in a double shell, i.e. totally enclosed by a fluid filled enclosure 1, both again enclosed by a second fluid filled enclosure 2. The first filled enclosure 1 is filled by a first fluid, whereas the second filled enclosure 2 is filled by a second fluid. Both fluids are particularly liquids, for example based on oil.

The second filled enclosure 2 may be surrounded by ambient sea water, which may have a high pressure in a subsea environment. Besides, sea water may be aggressive against metal parts.

Outside of the two filled enclosures 1,2 a first pressure compensator 10 and a second pressure compensator 20 are located, again both surrounded by sea water.

In a simplified manner, both pressure compensators 10,20 are considered to be cylinders with an opening at the bottom of the cylinder and an opening at the bottom of the cylinder. The cylinder itself may be installed vertically.

Focusing on the first pressure compensator 10, the opening at the bottom of the cylinder is providing access to a first chamber 11 within the pressure compensator 10 and the opening at the top of the cylinder giving access to a second chamber 12. In regards to the second pressure compensator 20, the opening at the bottom of the cylinder is providing access to a third chamber 21 within the pressure compensator 20 and the opening at the top of the cylinder giving access to a fourth chamber 22.

The cylinder can be filled from both sides via its openings by two different fluids. The fluids will be kept separated via an impermeable bellow, the first bellow 13 in case of the first pressure compensator 10 and the second bellow 23 in case of the second pressure compensator 20.

The bellows 13, 23 may automatically adjust themselves in volume and stroke due to the different fluid pressure in the separated chambers 11,12 or 21,22.

According to FIG. 1, bellow 13 will be bladder or blister filled by a first fluid, defining the first chamber 11. Access to the bellow 13 for the first fluid will be by an opening of the bottom of the cylinder. The surrounding of the bellow 13 inside the cylinder is filled by a second fluid and defines the second chamber 12, which is filled by the opening from the top of the cylinder.

The bellow 13 will have a mechanism, that the pressure of the second fluid is supported against the pressure of the first fluid. This is implemented via a first element 14 for the first bellow 13 (and a second element 24) for the second bellow 23), the element 14, 24 being attached to the most vertical section of the bellow 13,23 and having a weight, so that the force of gravity caused on that weight will add an additional pressure to the first fluid inside the first chamber 11 (or the fluid inside the third chamber 21).

According to FIG. 1, the first pressure compensator 10 is connected via a first manifold 40 to the fluid filled enclosure 1, also called the inner enclosure 1 in the following. The first manifold 40 is connected to the opening at the bottom of the first pressure compensator 10 via a valve 61 to inner enclosure 1. Thus, the manifold 40 provides a fluid communication between the first chamber 11 and the cavity 3 of the inner enclosure 1 via the first fluid. Possibly the first manifold 40 will be arranged to pierce the second fluid filled enclosure 2—also called outer enclosure 2 in the following—at a substantially most vertical point of the outer enclosure 2 and to be connected to the inner enclosure 1 at a substantially most minimal vertical point of the inner enclosure 1.

The second pressure compensator 20 is connected via a second manifold 41 to the first pressure compensator 10 and to the outer enclosure 2. The second manifold 41 is connected to the opening at the bottom of the second pressure compensator 20 directly to the opening at the top of the first pressure compensator 10 and via a valve 62 to outer enclosure 2. Thus, the manifold 41 provides a fluid communication between the third chamber 21 and the second chamber 12 and additionally a fluid communication between the third chamber 21 and the cavity 4 of the outer enclosure 2 via the second fluid. Possibly the second manifold 41 will be arranged to pierce the outer enclosure 2 at a substantially most vertical point of the outer enclosure 2 and to end at a substantially most minimal vertical point of the outer enclosure 2.

Furthermore the opening at the top of the second pressure compensator 20 is in direct fluid communication with the ambient sea water, so that surrounding water can enter the fourth chamber 22.

With such a system, as defined above, the double barrier approach and also the double compensators reduce the risk of leakage. This system will be able to operate without negative effects even in case of cracks in the outer enclosure 2 or in the second pressure compensator 20. Therefore this system is very reliable.

By using the bellows 13, 23 and by using elements 14, 24 as weights having an effect on the bellows 13, 23, a slight overpressure can be generated to the fluid in the bellows 13, 23. This may render the use of springs to generate such an overpressure superfluous. This may be advantageous because due to heat losses from the technical equipment 50 mounted and operated inside the inner enclosure 1 resulting in temperature and consequently volume changes in the fluid, a compensator volume and a stroke of the bellow 13, 23 can be considerable. But springs may be less smooth and uniform in generating an overpressure due to the spring constant. Therefore the replacement of conventional springs by a bellow with an attached dead weight may result in a more uniform operation of the pressure compensators.

The system according to FIG. 1 may provide easy access to the pressure compensators from outside, e.g., for maintenance or repair.

Regarding the valves 61, 62 in FIG. 1, additional valves may be necessary, for example for controlling the initial filling, etc. The location of the valves 61, 62 may be outside of both enclosures 1, 2—for example for easier replacement or repair—or inside the outer enclosure 2 and outside the inner enclosure 1. The valves 61, 62 may be needed for maintenance work.

In the following a different solution is explained by referring to FIG. 2, in which both pressure compensators are mounted inside the outer enclosure, which provides extra protection.

Figure 2:
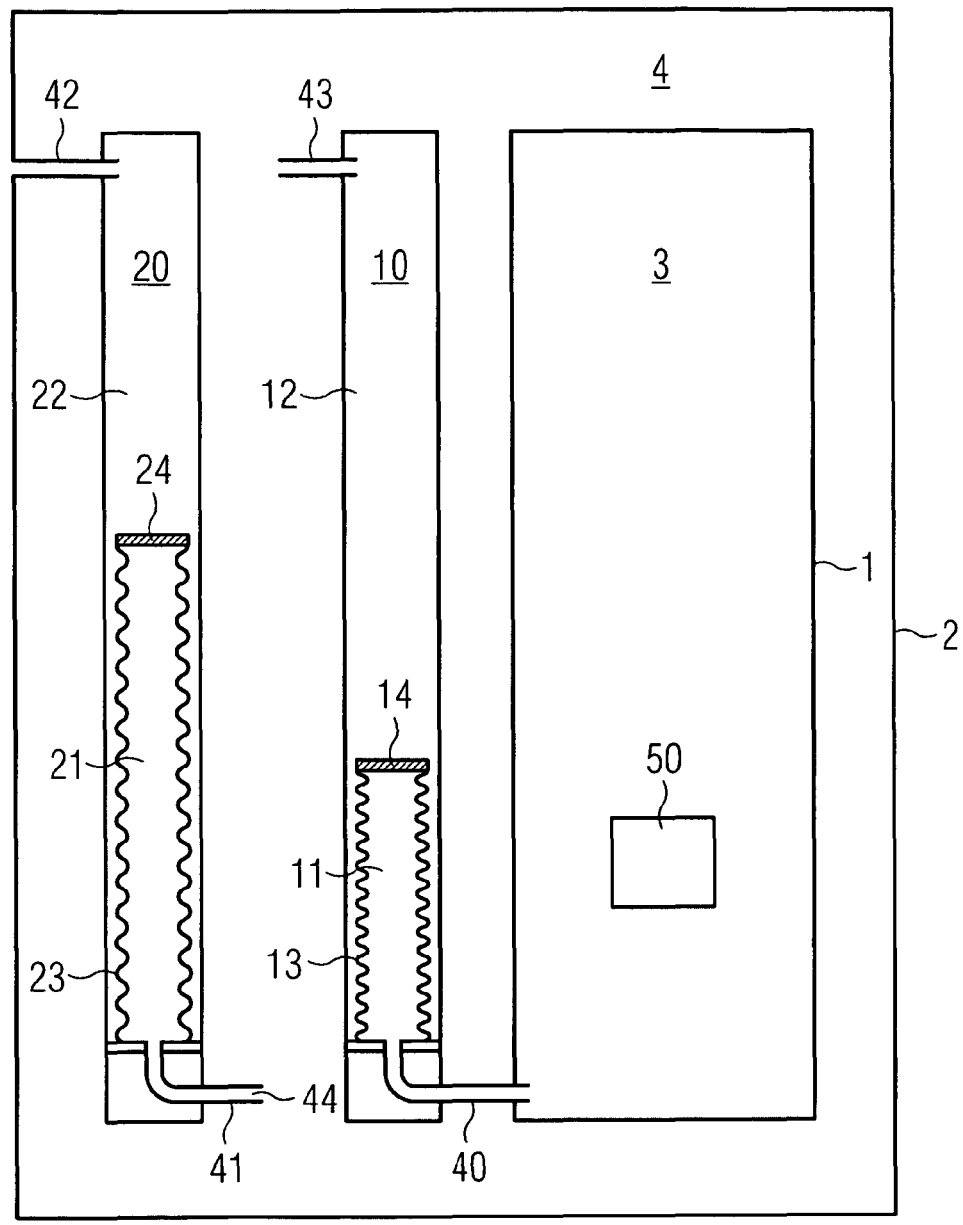
FIG. 2 shows schematically a double barrier pressure system in which two pressure compensators are located inside a surrounding enclosure, according to an example embodiment.

Most of the previously said applies also to FIG. 2. Therefore it will be focussed merely on the differences in comparison to FIG. 1.

According to the embodiment of FIG. 2, the inner enclosure 1, the first pressure compensator 10, and the second pressure compensator 20 are located inside of the outer enclosure 2.

The first pressure compensator 10 is connected via a first manifold 40 to the inner, fluid filled enclosure 1. The first manifold 40 is connected to the opening at the bottom of the first pressure compensator 10 and also connected to an opening at the bottom of the inner enclosure 1. Thus, the manifold 40 provides a fluid communication between the first chamber 11 and the cavity 3 of the inner enclosure 1 via the first fluid.

The second pressure compensator 20 is connected via a second manifold 41 to the cavity 4 within the outer enclosure 2, by simply having an opening 44 of the third chamber 21 to that cavity 4. Furthermore an opening 43 of the first pressure compensator 10 is not connected to a manifold but also ends in the cavity 4 within the outer enclosure 2. Indirectly, the flow path between the third chamber 21, the cavity 4 and the second chamber 12 provides a fluid communication between the third chamber 21 and the second chamber 12.

Furthermore, as before, the opening at the top of the second pressure compensator 20 is in direct fluid communication with the ambient sea water, so that surrounding water can enter the fourth chamber 22. For this a manifold or an inlet opening 42 may be required, so that the second fluid filled enclosure 2 gets pierced.

Figure 3:
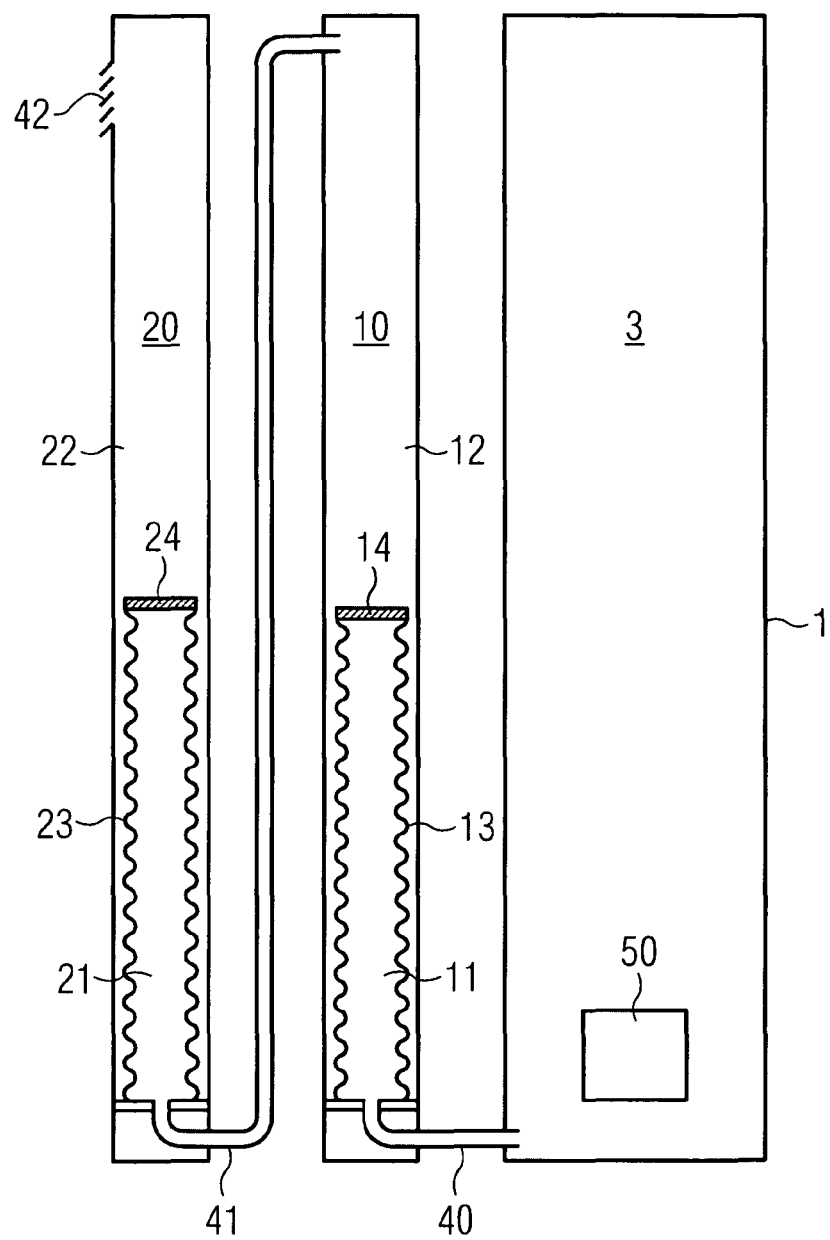
FIG. 3 shows schematically a single barrier pressure system using two pressure compensators, according to an example embodiment.

Continuing with FIG. 3, now an embodiment is described with a single barrier approach.

This approach is similar to FIG. 2, without having the outer enclosure 2. The first pressure compensator 10 is connected the same way as before via a first manifold 40 to the inner, fluid filled enclosure 1.

The second pressure compensator 20 is connected via a second manifold 41 to the cavity 4 within the outer enclosure 2. The manifold 41 is connected to the opening at the bottom of the second pressure compensator 20 and also to the opening of the first pressure compensator 10 at the top of the first pressure compensator 10. Thus, the flow path between the third chamber 21 and the second chamber 12 via the manifold 41 provides a fluid communication between the third chamber 21 and the second chamber 12.

Furthermore, as before, the opening at the top of the second pressure compensator 20 is in direct fluid communication with the ambient sea water, so that surrounding water can enter the fourth chamber 22.

The embodiment of FIG. 3 may be advantageous because the probability for a leak in a bellow can be higher than for a leak in a shell made of for example duplex steel and all welded.

The first fluid and the second fluid may be compatible to fulfil the "double shell philosophy".

What is claimed is:

1. A system for pressure compensation in a subsea environment, comprising:
   a fluid filled enclosure surrounding a cavity in which electrical or mechanical equipment is housed,
   a first pressure compensator having a first chamber and a second chamber, the first chamber being in fluid communication with the cavity, and
   a second pressure compensator having a third chamber and a fourth chamber,
   wherein the third chamber of the second pressure compensator is in fluid communication with the second chamber of the first pressure compensator,
   wherein a first liquid is provided inside the cavity of the fluid filled enclosure and the first chamber of the first pressure compensator,
   wherein a second liquid is provided inside the third chamber of the second pressure compensator and the second chamber of the first pressure compensator,
   wherein the first chamber of the first pressure compensator is separated from the second chamber of the first pressure compensator by a first bellow, wherein the first bellow automatically adjusts itself in volume and stroke based on a first pressure difference between the first and second chambers of the first pressure compensator, and
   wherein the third chamber of the second pressure compensator is separated from the fourth chamber of the second pressure compensator by a second bellow, wherein the second bellow automatically adjusts itself in volume and stroke based on a second pressure difference between the third and fourth chambers of the second pressure compensator.

2. The system of claim 1, wherein each of the first and second bellows includes an element with a weight, the element arranged with respect to the respective bellow such that the weight of the element provides a force to reduce the stroke of the respective bellow.

3. The system of claim 1, further comprising at least one of:
a first manifold connecting the fluid filled enclosure with the first chamber to allow a flow of a first fluid;
a second manifold connecting the third chamber with the second chamber to allow a flow of a second fluid; and
an inlet opening to the fourth chamber to allow a flow of sea water from a surrounding area of the system.

4. The system of claim 1, wherein the fluid filled enclosure is enclosed by a further fluid filled enclosure surrounding a further cavity.

5. The system of claim 4, wherein the first pressure compensator and the second pressure compensator are both enclosed by the further fluid filled enclosure and both surrounded by the same fluid.

6. The system of claim 4, wherein the second chamber of the first pressure compensator has a first opening to the further cavity of the further fluid filled enclosure, and the third chamber of the second pressure compensator has a second opening to the further cavity, such as the third chamber of the second pressure compensator is in fluid communication with the further cavity and the second chamber of the first pressure compensator is in fluid communication with the further cavity.

7. The system of claim 4, further comprising a manifold connecting the third chamber with the second chamber to allow a flow of the second fluid, wherein the manifold includes a connection to allow a flow of the second fluid to the further cavity of the further fluid filled enclosure.

8. The system of claim 4, wherein both the first pressure compensator and the second pressure compensator are located outside the further fluid filled enclosure.

9. A system for pressure compensation in a subsea environment, comprising:
a fluid filled enclosure surrounding a cavity in which electrical or mechanical equipment is housed,
a first pressure compensator having a first chamber and a second chamber separated by a first bellow, wherein the first chamber is in fluid communication with the cavity, and
a second pressure compensator having a third chamber and a fourth chamber separated by a second bellow,
wherein the third chamber of the second pressure compensator is in fluid communication with the second chamber of the first pressure compensator,
wherein a first liquid is provided inside the cavity of the fluid filled enclosure and the first chamber of the first pressure compensator,
wherein a second liquid is provided inside the third chamber of the second pressure compensator and the second chamber of the first pressure compensator,
wherein the first chamber of the first pressure compensator is separated from the second chamber of the first pressure compensator by a first bellow, wherein the first bellow automatically adjusts itself in volume and stroke based on a first pressure difference between the first and second chambers of the first pressure compensator, and
wherein the third chamber of the second pressure compensator is separated from the fourth chamber of the second pressure compensator by a second bellow, wherein the second bellow automatically adjusts itself in volume and stroke based on a second pressure difference between the third and fourth chambers of the second pressure compensator.

10. The system of claim 9, wherein each of the first and second bellows includes an element with a weight, the element arranged with respect to the respective bellow such that the weight of the element provides a force to reduce the stroke of the respective bellow.

11. The system of claim 9, further comprising at least one of:
a first manifold connecting the fluid filled enclosure with the first chamber to allow a flow of a first fluid;
a second manifold connecting the third chamber with the second chamber to allow a flow of a second fluid; and
an inlet opening to the fourth chamber to allow a flow of sea water from a surrounding area of the system.

12. The system of claim 9, wherein the fluid filled enclosure is enclosed by a further fluid filled enclosure surrounding a further cavity.

13. The system of claim 12, wherein the first pressure compensator and the second pressure compensator are both enclosed by the further fluid filled enclosure and both surrounded by the same fluid.

14. The system of claim 12, wherein the second chamber of the first pressure compensator has a first opening to the further cavity of the further fluid filled enclosure, and the third chamber of the second pressure compensator has a second opening to the further cavity, such as the third chamber of the second pressure compensator is in fluid communication with the further cavity and the second chamber of the first pressure compensator is in fluid communication with the further cavity.

15. The system of claim 12, further comprising a manifold connecting the third chamber with the second chamber to allow a flow of the second fluid, wherein the manifold includes a connection to allow a flow of the second fluid to the further cavity of the further fluid filled enclosure.

16. The system of claim 12, wherein both the first pressure compensator and the second pressure compensator are located outside the further fluid filled enclosure.

* * * * *